(12) United States Patent
Mataya et al.

(10) Patent No.: US 9,098,416 B2
(45) Date of Patent: *Aug. 4, 2015

(54) FLASH STORAGE DEVICE WITH READ DISTURB MITIGATION

(71) Applicant: STEC, Inc., Santa Ana, CA (US)

(72) Inventors: Richard A. Mataya, Rancho Santa Margarita, CA (US); Po-Jen Hsueh, Kaohsiung (TW); Mark Moshayedi, Newport Coast, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/257,978

(22) Filed: Apr. 21, 2014

(65) Prior Publication Data
US 2014/0223244 A1 Aug. 7, 2014

Related U.S. Application Data

(63) Continuation of application No. 12/779,001, filed on May 12, 2010, now Pat. No. 8,719,652.

(60) Provisional application No. 61/177,601, filed on May 12, 2009.

(51) Int. Cl.
*G11C 16/34* (2006.01)
*G06F 12/08* (2006.01)
*G06F 12/10* (2006.01)
*G06F 11/07* (2006.01)
*G06F 12/02* (2006.01)

(52) U.S. Cl.
CPC .......... *G06F 12/0833* (2013.01); *G06F 11/076* (2013.01); *G06F 12/0246* (2013.01); *G06F 12/0284* (2013.01); *G06F 12/0866* (2013.01); *G06F 12/1009* (2013.01); *G11C 16/3418* (2013.01); *G06F 2212/2022* (2013.01); *G06F 2212/466* (2013.01); *G06F 2212/62* (2013.01); *G06F 2212/7208* (2013.01); *G06F 2212/7209* (2013.01); *G11C 16/349* (2013.01)

(58) Field of Classification Search
CPC ................... G06F 2212/7201; G06F 12/0246; G11C 16/3418
USPC ......................................................... 714/745
See application file for complete search history.

(56) References Cited

U.S. PATENT DOCUMENTS

| 5,434,982 | A * | 7/1995 | Calzi | 710/104 |
| 5,745,789 | A | 4/1998 | Kakuta | |
| 6,266,759 | B1 | 7/2001 | Birrittella | |
| 6,345,001 | B1 * | 2/2002 | Mokhlesi | 365/185.33 |

(Continued)

FOREIGN PATENT DOCUMENTS

| CN | 1129518 A1 | 8/1996 |
| EP | 707793 A1 | 4/1996 |

*Primary Examiner* — Steve Nguyen
(74) *Attorney, Agent, or Firm* — McDermott Will & Emery LLP

(57) ABSTRACT

A method for managing a flash storage device includes initiating a read request and reading requested data from a first storage block of a plurality of storage blocks in the flash storage device based on the read request. The method further includes incrementing a read count for the first storage block and moving the data in the first storage block to an available storage block of the plurality of storage blocks when the read count reaches a first threshold value.

18 Claims, 3 Drawing Sheets

(56) References Cited

U.S. PATENT DOCUMENTS

| | | | |
|---|---|---|---|
| 6,725,342 B1* | 4/2004 | Coulson | 711/141 |
| 6,788,605 B2* | 9/2004 | Sharma et al. | 365/220 |
| 7,091,740 B2* | 8/2006 | Simons | 326/8 |
| 7,467,337 B2* | 12/2008 | Nakamura et al. | 714/704 |
| 7,610,438 B2 | 10/2009 | Lee et al. | |
| 7,707,354 B2 | 4/2010 | Lee et al. | |
| 7,818,525 B1 | 10/2010 | Frost et al. | |
| 7,859,932 B2 | 12/2010 | Mokhlesi | |
| 7,864,579 B2 | 1/2011 | Gutsche et al. | |
| 7,929,372 B2* | 4/2011 | Han et al. | 365/230.06 |
| 8,010,739 B2* | 8/2011 | Watanabe et al. | 711/103 |
| 8,074,011 B2* | 12/2011 | Flynn et al. | 711/103 |
| 8,189,379 B2* | 5/2012 | Camp et al. | 365/185.02 |
| 8,281,220 B2* | 10/2012 | Kitahara | 714/764 |
| 2002/0166022 A1 | 11/2002 | Suzuki | |
| 2004/0221128 A1 | 11/2004 | Beecroft et al. | |
| 2005/0251617 A1 | 11/2005 | Sinclair et al. | |
| 2007/0124531 A1 | 5/2007 | Nishihara | |
| 2008/0001958 A1 | 1/2008 | Vembu et al. | |
| 2008/0177937 A1 | 7/2008 | Nishihara et al. | |
| 2008/0288814 A1 | 11/2008 | Kitahara | |
| 2009/0125671 A1 | 5/2009 | Flynn et al. | |
| 2009/0132876 A1* | 5/2009 | Freking et al. | 714/723 |
| 2009/0172254 A1 | 7/2009 | Chen | |
| 2009/0193174 A1* | 7/2009 | Reid | 711/100 |
| 2009/0216936 A1 | 8/2009 | Chu et al. | |
| 2009/0265503 A1 | 10/2009 | Hung et al. | |
| 2009/0282187 A1 | 11/2009 | Ito et al. | |
| 2010/0064095 A1 | 3/2010 | Chen et al. | |
| 2010/0070735 A1 | 3/2010 | Chen et al. | |
| 2010/0100665 A1 | 4/2010 | Lin | |
| 2010/0107021 A1* | 4/2010 | Nagadomi et al. | 714/704 |
| 2010/0122148 A1 | 5/2010 | Flynn et al. | |
| 2010/0161886 A1 | 6/2010 | Toelkes et al. | |
| 2010/0185806 A1 | 7/2010 | Pruthi et al. | |
| 2011/0038203 A1 | 2/2011 | Camp et al. | |
| 2011/0161557 A1 | 6/2011 | Haines et al. | |

\* cited by examiner

| VIRTUAL ADDRESS | PHYSICAL ADDRESS | READ COUNT |
|---|---|---|
| VBA 0 | PBA 1 | RC 1 |
| VBA 1 | PBA 5 | RC 5 |
| VBA 2 | PBA 3 | RC 3 |
| VBA 3 | PBA 9 | RC 9 |
| VBA 4 | PBA 0 | RC 0 |
| VBA 5 | PBA 7 | RC 7 |
| VBA 6 | PBA 11 | RC 11 |
| VBA 7 | PBA 2 | RC 2 |

FIG. 3

FLASH STORAGE DEVICE WITH READ DISTURB MITIGATION

CROSS-REFERENCE TO RELATED APPLICATIONS

The present application is a continuation application of U.S. patent application Ser. No. 12/779,001 entitled "FLASH STORAGE DEVICE WITH READ DISTURB MITIGATION," filed on May 12, 2010, which claims the benefit of U.S. Provisional Application No. 61/177,601, filed on May 12, 2009, the contents both of which are incorporated by reference in their entirety herein.

BACKGROUND

The present disclosure concerns flash storage devices and, more particularly, flash storage devices configured to mitigate read disturb errors.

Flash memory comprises an array of memory cells. Each memory cell includes a floating gate transistor that is used to store one or more bits of data. The floating gate transistor in a memory cell is programmed by placing an amount of charge on the floating gate, which increases the threshold voltage of the transistor. To read the memory cell, a read voltage above the threshold voltage of an unprogrammed transistor and below the threshold voltage of a programmed transistor is applied to the control gate of the transistor. An unprogrammed transistor will conduct at the read voltage, while a programmed transistor will not. By sensing conduction with the read voltage applied, the programmed state of the transistor may be read.

NAND flash memory is organized into strings of transistors. Each string includes multiple transistors linked together by connecting the source of one transistor to the drain of an adjacent transistor. The strings of transistors typically are organized into physical blocks, each physical block comprising a number of pages. The transistors within a string correspond to different respective pages in a physical block. A page is read out of a physical block by applying a read voltage to the control gate of the transistor corresponding to the particular page in each string of the physical block. During a read operation, the other transistors in the strings are operated in a conducting state by placing a voltage at or above the threshold voltage of a programmed transistor on the respective control gates.

Repeated read operations to a physical block may generate bit errors in one or more pages within the physical block. As noted above, transistors not being read are operated in a conducting state during a read operation. The voltage applied to these transistors may transfer a small amount of charge to the transistors' floating gates. After a number of read operations, the cumulative amount of transferred charge may cause a previously unprogrammed transistor to be incorrectly read as a programmed transistor. These errors, referred to as read disturb errors, may result in data loss within physical blocks containing frequently read pages unless the flash memory is managed to mitigate read disturb errors and the potential data loss associated with these errors.

SUMMARY

The subject technology mitigates read disturb errors in a flash storage device by tracking the number of times data is read from the physical storage blocks in the device. The read counts for the physical storage blocks may be compared against a threshold value and preventative action may be taken if the read counts reach the threshold value.

According to one aspect of the subject technology, a method for managing a flash storage device is provided. The method includes initiating a read request and reading requested data from a first storage block of a plurality of storage blocks in the flash storage device based on the read request. The method further includes incrementing a read count for the first storage block and moving the data in the first storage block to an available storage block of the plurality of storage blocks when the read count reaches a first threshold value.

According to another aspect of the subject technology, a flash storage device is provided. The flash storage device includes a flash memory and a controller. The controller is configured to initiate a read request and read requested data from a first storage block of a plurality of storage blocks in the flash memory based on the read request. The controller is further configured to increment a read count for the first storage block and move the data in the first storage block to an available storage block in the flash memory when the read count reaches a first threshold value.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 3 is a depiction of a virtual-to-physical address mapping table according to one aspect of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Figure 1:
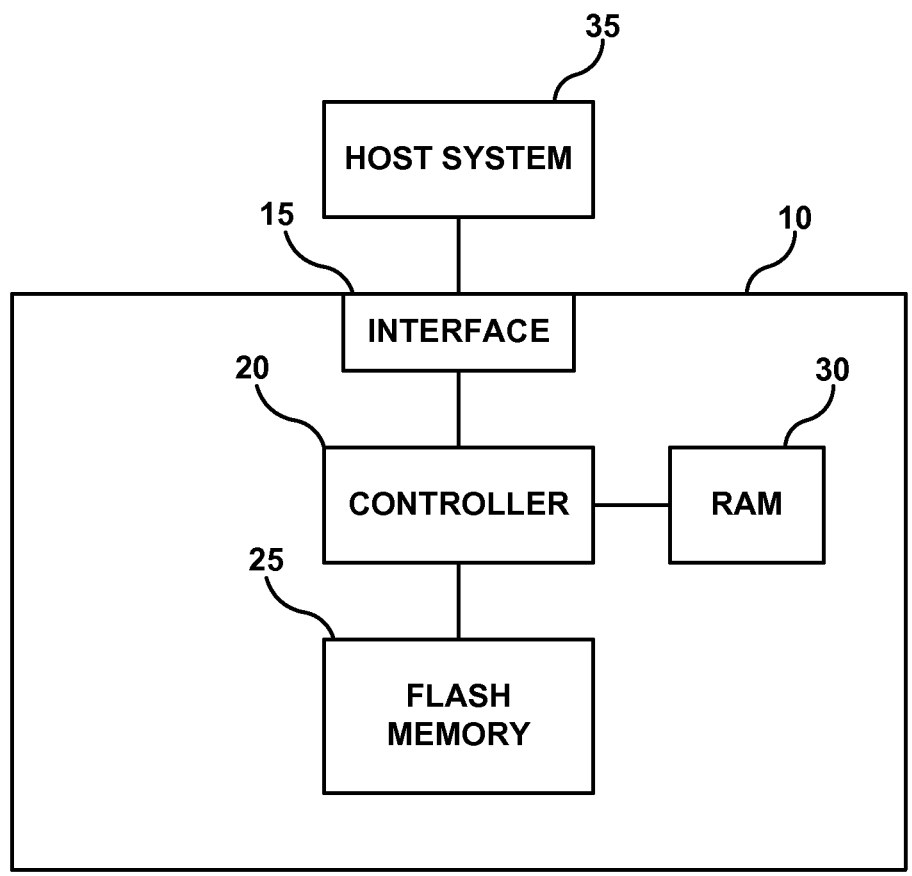
FIG. 1 is a block diagram illustrating components of a flash storage device according to one aspect of the subject technology.

FIG. 1 is a block diagram illustrating components of a flash storage device 10 according to one aspect of the subject technology. As depicted in FIG. 1, flash storage device 10 includes interface 15, controller 20, flash memory 25, and random access memory (RAM) 30. Interface 15 facilitates communication of data, commands, and/or control signals between flash storage device 10 and host system 35. Controller 20 controls the operation of flash storage device 10 to store and retrieve data in flash memory 25 in accordance with commands received from host system 35. RAM 30 provides temporary storage space for controller 20 to process commands and transfer data between host system 35 and flash memory 25. The operation of each of these components is described in more detail below.

Interface 15 provides a physical and electrical connection between host system 35 and flash storage device 10. Interface 15 is configured to facilitate communication of data, commands, and/or control signals between host system 35 and flash storage device 10 via the physical and electrical connection. The connection and the communications with interface 15 may be based on a standard interface such as Universal Serial Bus (USB), Small Computer System Interface (SCSI), Serial Advanced Technology Attachment (SATA), etc. Alternatively, the connection and/or communications may be based on a proprietary interface. Those skilled in the art will recognize that the subject technology is not limited to any particular type of interface.

Controller 20 manages the flow of data between host system 35 and flash memory 25. Controller 20 is coupled to interface 15 and is configured to receive commands and data from host system 35 via interface 15. For example, controller 20 may receive data and a write command from host system 35 to write the data in flash memory 25. Controller 20 is further configured to send data to host system via interface 15. For example, controller 20 may read data from flash memory 25 and send the data to host system 35 in response to a read command. Controller 20 is further configured to manage data stored in flash memory 25 and RAM 30 based on internal control algorithms or other types of commands that may be received from host system 35. Those skilled in the art will be familiar with other conventional operations performed by a controller in a flash storage device, which will not be described in detail herein.

Controller 20 may be implemented with a general purpose processor, micro-controller, digital signal processor (DSP), an application specific integrated circuit (ASIC), a field programmable gate array (FPGA) or other programmable logic device, discrete gate or transistor logic device, discrete hardware components, or any combination thereof designed and configured to perform the operations and functions described herein. Controller 20 may perform the operations and functions described herein by executing one or more sequences of instructions stored on a machine/computer readable medium. The machine/computer readable medium may be flash memory 25, RAM 30, or other types of readable media from which controller 20 can read instructions or code. For example, flash storage device 10 may include a read only memory (ROM), such as an EPROM or EEPROM, encoded with firmware/software comprising one or more sequences of instructions read and executed by controller 20 during the operation of flash storage device 10.

Flash memory 25 represents one or more flash memory devices. The flash memory devices may all be located on a single flash chip or arranged on multiple flash chips. The flash memory devices may be split among multiple channels through which data is read from and written to the flash memory devices by controller 20, or coupled to a single channel. Flash memory 25 may be implemented using NAND flash, which as discussed above may result in read disturb data errors with frequent read access.

Flash memory 25 comprises multiple memory cells divided into storage blocks. These storage blocks may be referred to as data blocks or memory blocks and are addressable by controller 20 using a physical block address. Each of the storage blocks is further divided into multiple data segments or pages addressable by controller 20 using a physical page address or offset from a physical block address of the storage block containing the referenced page. The storage blocks represent the units of data that are erased within flash memory 25 in a single erase operation. The physical pages represent the units of data that are read from or written to flash memory 25 in a single read or write operation. Those skilled in the art may recognize other terminology conventionally used to refer to these data units within a flash memory.

The subject technology is not limited to any particular capacity of flash memory. For example, storage blocks in flash memory 25 may each comprise 32, 64, or 128 pages. Additionally, pages in flash memory 25 may each comprise 512 bytes, 2 kilobytes, or 4 kilobytes.

RAM 30 represents a volatile memory coupled to and used by controller 20 during operation of flash storage device 10. Controller 20 may buffer commands and/or data in RAM 30. Controller 20 also may use RAM 30 to store address translations tables used to convert logical data addresses used by host system 35 into virtual and/or physical addresses corresponding to portions of flash memory 25. Other types of tables, data, status indicators, etc. conventionally used to manage flash storage devices also may be stored in RAM 30 by controller 20. RAM 30 may be implemented using dynamic random access memory (DRAM), static random access memory (SRAM), or other types of volatile random access memory known to those skilled in the art without departing from the scope of the subject technology.

Figure 2:
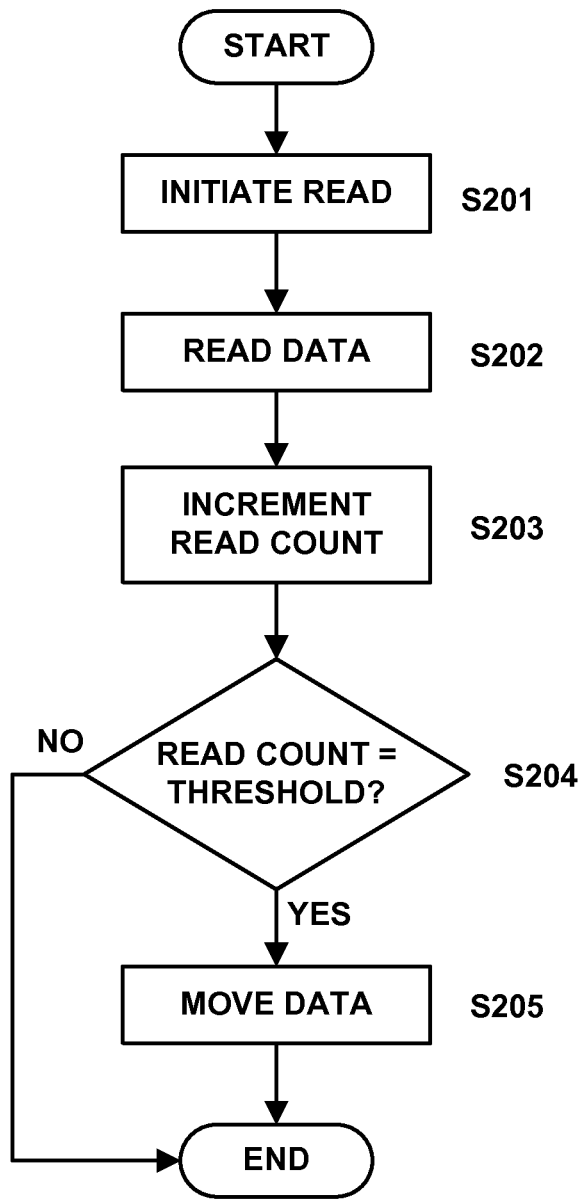
FIG. 2 is a flowchart illustrating a method for managing a flash storage device according to one aspect of the subject technology.

FIG. 2 is a flowchart illustrating a method for managing flash storage device 10 according to one aspect of the subject technology. The method may be performed by controller 20 reading and executing one or more sequences of instructions from a medium encoded with the instructions. The method begins once controller 20 has completed any start-up tasks and housekeeping procedures required once flash storage device 10 has been powered up or operation interrupted for maintenance purposes and a read request has been received. The read request may be based on a command received from host system 35 via interface 35. Alternatively, the read request may be generated by an internal process, such as a maintenance process, executed by controller 20. Upon receiving a read request, controller 20 initiates the read request in step S201. Initiating the read request may include decoding the request to determine the address and quantity of data requested. Once the read request has been initiated, the process continues to step S202.

In step S202, controller 20 processes the read request. Processing the read request may include translating a logical address in the read request, such as a logical address used by host system 35 to identify the requested data, into a physical address identifying the storage block and page within flash memory 25 containing the requested data. Address translation also may involve translating the logical address to an intermediate virtual address used by controller 20 to manage the data in flash memory 25, which is subsequently translated to the physical address in flash memory 25. Controller 20 may use one or more translation tables stored in RAM 30 to map the logical addresses referenced by host system 35 into the virtual address and/or physical addresses used to identify portions of flash memory 25. Once the physical address of the requested data is determined by controller 20, appropriate control and addressing signals are applied to flash memory 25 to read out the page containing the requested data. Read operations for flash memory are well known to those skilled in the art and will not be described in further detail herein.

According to one aspect of the subject technology, controller 20 maintains a read count in RAM 30 for each storage block in flash memory 25 containing data. The read count indicates the number of read operations that have been performed by controller 20 on the respective storage block. After controller 20 has read out the page containing the requested data from flash memory 25, controller 20 increments the read count for the storage block containing the read page in step S203 to reflect another read operation having been performed on the storage block.

Various data structures may be used by controller 20 to maintain the read counts for the storage blocks in flash memory 25 containing data. For example, FIG. 3 depicts a virtual-to-physical address mapping table to which an additional column containing read counts has been added according to one aspect of the subject technology. The virtual addresses in the first column of the table (e.g., VBA 0, VBA 1, VBA 2, etc.) represent either the logical addresses referenced by host system 35 or an intermediate virtual address referenced by controller 20 to facilitate various flash memory management algorithms known to those skilled in the art. The physical addresses in the second column of the table (e.g., PBA 1, PBA 5, PBA 3, etc.) represent the physical address of the storage block within flash memory 25 containing the data referenced by the corresponding virtual address in the first column. Address mapping and the various tables used for address mapping are well known to those skilled in the art and will not be described in further detail herein.

As noted above, the table depicted in FIG. 3 includes an additional column containing read counts (e.g., RC 1, RC 5, RC 3, etc.) indicating the number of read operations that have been performed on the storage block identified by the corresponding physical address in the table. Specifically, RC 1 contains a read count for the storage block identified by physical address PBA 1, RC 5 contains a read count for the storage block identified by physical address PBA 5, etc. The read count for a particular storage block is initialized to zero when the storage block is first programmed with data after having been erased and incremented each time a page within the storage block is read.

Those skilled in the art will recognize other data structures that may be used to maintain read counts for the storage blocks within flash memory 25 without departing from the scope of the subject technology. For example, controller 20 may maintain a read count for every storage block in flash memory 25 using a dedicated table containing the physical addresses of each of the storage blocks and the respective read counts. Alternatively, controller 20 may create a read count for a particular storage block only after data has been written into one or more pages within the storage block.

In step S204 shown in FIG. 2, controller 20 compares the read count of the storage block containing the read requested data against a threshold value. If the read count equals the threshold value, the process proceeds to step S205. Otherwise, the process ends until another read request is either received in a command from host system 35 or generated by an internal process within controller 20.

The threshold value represents a number of read counts after which a read disturb error is likely to occur in one or more memory cells within a storage block. The threshold value may be determined based on testing flash memory chips subjected to repeated read operations. Alternatively, the threshold value may be determined by observing the performance of flash storage devices operating with various threshold values or simply setting the threshold value based on conservative estimates of flash memory performance. According to one aspect of the subject technology the threshold value is set at 8192.

According to one aspect of the subject technology, the threshold value is set at the time of manufacture of flash storage device 10. Alternatively, controller 20 may be configured to set the threshold value based on one or more operational parameters of flash storage device 10. For example, controller 20 may reduce the threshold value as flash storage device 10 ages. The older and more used flash storage device 10 is, the more likely read disturb errors will occur.

In step S205, controller 20 moves the data contained within the storage block having the read count equal to the threshold value to an available storage block within flash memory 25. The process of moving the data within the storage block may include controller 20 marking the storage block for wear leveling according to one or more wear-leveling algorithms implemented by controller 20. Wear-leveling algorithms are well known to those skilled in the art and the subject technology is not limited to any particular type of wear-leveling algorithm that may be used to identify an available storage block within flash memory 25 and move data to that storage block. Alternatively, controller 20 may identify an available storage block from a group of currently erased (unprogrammed) storage blocks or an available storage block from a group of storage blocks having sufficient capacity to store the data from the first storage block and having a read count below the first threshold value.

As described above, controller 20 maintains the read counts for the storage blocks in RAM 30, which is volatile memory. Accordingly, if flash storage device 10 is powered down, the read counts for the storage blocks may be lost. According to one aspect of the subject technology, controller 20 may be configured to take steps to back up the read counts in order to maintain them across power cycles. For example, controller 20 may store the read counts in flash memory 25 when flash storage device 10 is powered down. Controller 20 may store the read counts along with any tables, such as that depicted in FIG. 3, in flash memory 25, or may store the read counts in reserved portions of the respective storage blocks corresponding to the read counts. When flash storage device 10 is powered up, controller 20 may then retrieve the read counts for the storage blocks either be retrieving the stored tables or by populating a table reading the read counts from each storage block.

Controller 20 also may be configured to back up the read counts to non-volatile memory such as flash memory 25 at other times besides during a power down operation. For example, controller 20 may back up the read counts at regular intervals during operation of flash storage device 10. The subject technology is not limited to any particular interval for backing up the read counts. The intervals may be hourly, daily, weekly, etc. or may be based on monitoring other operation parameters by controller 20. These operation parameters may include the frequency of commands received from host system 35, the rate of operations performed by controller 20, etc.

As noted above, flash memory 25 is organized into physical storage blocks. The storage blocks may be grouped into zones, with each zone containing two or more storage blocks. Controller 20 may be configured to back up the read counts for each of the storage blocks within a particular zone when the read count of any one of the storage blocks reaches the threshold value causing the data for that storage block to be moved to an available storage block, or when any of the read counts reach a lower threshold value less than the value triggering a data move.

Controller 20 may be configured to perform a read check or verify operation on each page read from flash memory 25, such as during step S202 in FIG. 2. For example, controller 20 may verify the data stored in a particular read page using an error-correcting code (ECC) stored in the page along with the data. If the read check or verify operation fails, controller 20 may move all of the data in the storage block containing the page to an available storage block, such as in step S205 in FIG. 2. Controller 20 may move the data in the storage block if the read check indicates a single bit error in the read page. Alternatively, controller 20 may move the data in the storage block if the read check indicates a number of bit errors greater than a safety count representing a number of errors greater than one up to the maximum number of bit errors correctable by the error correction algorithm employed by controller 20.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for managing a flash storage device, the method comprising the steps of:
   initiating a read request;
   reading requested data from a first storage block of a plurality of storage blocks in the flash storage device based on the read request, wherein each of the plurality of storage blocks comprises multiple pages, the plurality of storage blocks in the flash storage device are organized into a plurality of zones, each zone comprises at least two storage blocks of the plurality of storage blocks, each storage block has a respective read count, and the first storage block is included in a first zone of the plurality of zones;
   incrementing the read count for the first storage block;
   determining that the read count for the first storage block has reached a first threshold value;
   in response to the determination:
      moving the data in the first storage block to an available storage block of the plurality of storage blocks; and
      backing up the read counts for each storage block in the first zone to a non-volatile memory in the flash storage device;
   determining that the read count of at least one of the storage blocks in a second zone of the plurality of zones has reached a second threshold value less than the first threshold value; and
   backing up the read counts for each storage block in the second zone to the non-volatile memory, in response to determining that the read count of at least one of the storage blocks in the second zone has reached the second threshold value.

2. The method of claim 1, further comprising maintaining the read count for each of the plurality of storage blocks in the flash storage device containing data.

3. The method of claim 2, wherein maintaining the read count for each of the plurality of storage blocks containing data comprises storing the read counts in a random access memory in the flash storage device.

4. The method of claim 2, wherein the random access memory comprises a dynamic random access memory.

5. The method of claim 2, wherein maintaining the read count for each of the plurality of storage blocks containing data further comprises storing the read counts in the non-volatile memory in the flash storage device when the flash storage device is powered down.

6. The method of claim 2, wherein maintaining the read count for each of the plurality of storage blocks containing data further comprises storing the read counts in the non-volatile memory in the flash storage device at a predetermined interval.

7. The method of claim 1, further comprising:
performing a read check on the requested data stored in the first storage block; and
moving the data in the first storage block to an available storage block of the plurality of storage blocks when the read check fails.

8. The method of claim 7, wherein performing the read check comprises verifying the data stored in the first storage block using an error-correcting code in the stored data, and wherein the read check fails when an error count in the read-checked data is greater than a safety count.

9. The method of claim 1, wherein the available storage block is an erased storage block.

10. The method of claim 1, wherein the available storage block is a second storage block of the plurality of storage blocks having a read count less than the first threshold value.

11. A flash storage device comprising:
a flash memory; and
a controller configured to:
initiate a read request;
read requested data from a first storage block of a plurality of storage blocks in the flash storage device based on the read request, wherein each of the plurality of storage blocks comprises multiple pages, the plurality of storage blocks in the flash storage device are organized into a plurality of zones, each zone comprises at least two storage blocks of the plurality of storage blocks, each storage block has a respective read count, and the first storage block is included in a first zone of the plurality of zones;
increment the read count for the first storage block;
determine that the read count for the first storage block has reached a first threshold value;
in response to the determination that the read count for the first storage block has reached a first threshold value:
move the data in the first storage block to an available storage block of the plurality of storage blocks; and back up the read counts for each storage block in the first zone to a non-volatile memory in the flash storage device;
determine that the read count of at least one of the storage blocks in a second zone of the plurality of zones has reached a second threshold value less than the first threshold value; and
back up the read counts for each storage block in the second zone to the non-volatile memory, in response to the determination that the read count of at least one of the storage blocks in the second zone has reached the second threshold value.

12. The flash storage device of claim 11, wherein the controller is further configured to maintain the read count for each of the plurality of storage blocks in the flash storage device containing data.

13. The flash storage device of claim 12, wherein maintaining the read count for each of the plurality of storage blocks containing data comprises storing the read counts in a random access memory in the flash storage device.

14. The flash storage device of claim 12, wherein the random access memory comprises a dynamic random access memory.

15. The flash storage device of claim 12, wherein maintaining the read count for each of the plurality of storage blocks containing data further comprises storing the read counts in the non-volatile memory in the flash storage device when the flash storage device is powered down.

16. The flash storage device of claim 12, wherein maintaining the read count for each of the plurality of storage blocks containing data further comprises storing the read counts in the non-volatile memory in the flash storage device at a predetermined interval.

17. The flash storage device of claim 11, wherein the controller is further configured to:
perform a read check on the requested data stored in the first storage block; and
move the data in the first storage block to an available storage block of the plurality of storage blocks when the read check fails.

18. The flash storage device of claim 17, wherein performing the read check comprises verifying the data stored in the first storage block using an error-correcting code in the stored data, and wherein the read check fails when an error count in the read-checked data is greater than a safety count.

* * * * *